(12) United States Patent
Hsieh

(10) Patent No.: US 11,910,550 B2
(45) Date of Patent: Feb. 20, 2024

(54) DISPLAY

(71) Applicant: AUO Display Plus Corporation, Hsinchu (TW)

(72) Inventor: Hsin-Yi Hsieh, Hsinchu (TW)

(73) Assignee: AUO DISPLAY PLUS CORPORATION, Hsinchu (TW)

( * ) Notice: Subject to any disclaimer, the term of this patent is extended or adjusted under 35 U.S.C. 154(b) by 0 days.

(21) Appl. No.: 17/958,609

(22) Filed: Oct. 3, 2022

(65) Prior Publication Data
US 2024/0023257 A1   Jan. 18, 2024

(30) Foreign Application Priority Data

Jul. 14, 2022 (TW) .................................. 111126547

(51) Int. Cl.
*H05K 5/02* (2006.01)
(52) U.S. Cl.
CPC ................................. *H05K 5/0217* (2013.01)
(58) Field of Classification Search
CPC ....................... H05K 5/0217; G02F 1/133308
See application file for complete search history.

(56) References Cited

U.S. PATENT DOCUMENTS

| | | | | |
|---|---|---|---|---|
| 6,950,154 B2* | 9/2005 | Lee | ................... | G02F 1/133308 349/65 |
| 7,626,747 B2* | 12/2009 | Murakata | ............. | G02B 6/0088 359/253 |
| 7,973,872 B2* | 7/2011 | Kim | ................... | G02F 1/133606 362/633 |
| 8,111,351 B2* | 2/2012 | Cho | ................... | G02F 1/133608 349/64 |
| 8,243,223 B2* | 8/2012 | Lee | ................... | G02F 1/133308 349/58 |
| 8,625,049 B2* | 1/2014 | Kim | ........................ | G02B 6/005 362/97.3 |
| 8,931,946 B2* | 1/2015 | Shin | ....................... | G06K 19/06 362/97.4 |
| 9,810,834 B2* | 11/2017 | Kawabata | ......... | G02F 1/133308 |
| 9,851,491 B2* | 12/2017 | Ryu | ....................... | G02B 6/005 |

(Continued)

FOREIGN PATENT DOCUMENTS

| | | |
|---|---|---|
| CN | 110873922 A | 3/2020 |
| TW | I442138 B | 6/2014 |

(Continued)

*Primary Examiner* — Sagar Shrestha
(74) *Attorney, Agent, or Firm* — WPAT, PC

(57) ABSTRACT

A display includes a frame body and an optical film. Each of the first side wall and the third side wall of the frame body has a first positioning structure. Two end portions of each of the second sidewall and the fourth sidewall are bent toward the accommodating space to form second positioning structures. The optical film includes first positioning pieces and second positioning pieces. The first positioning pieces are respectively at the first side and the third side of the optical film, and each of the first positioning structures passes through a corresponding one of the first positioning pieces. The second positioning pieces respectively extend along a direction parallel to the first side or the third side of the optical film, and each of the second positioning pieces corresponds to a corresponding one of the second positioning structures.

6 Claims, 9 Drawing Sheets

(56) References Cited

U.S. PATENT DOCUMENTS

| | | | |
|---|---|---|---|
| 10,641,946 B2* | 5/2020 | Chang | G02B 6/0091 |
| 10,725,233 B2* | 7/2020 | Ma | G02B 6/0088 |
| 11,085,593 B2* | 8/2021 | Sasaki | G02F 1/133611 |
| 2005/0243238 A1* | 11/2005 | Cha | G02F 1/133606 |
| | | | 349/62 |
| 2005/0254261 A1* | 11/2005 | Lo | G02B 6/0088 |
| | | | 362/633 |
| 2006/0007367 A1* | 1/2006 | Cho | G02F 1/133308 |
| | | | 349/58 |
| 2006/0028836 A1* | 2/2006 | Shin | G02B 6/009 |
| | | | 362/600 |
| 2006/0203519 A1* | 9/2006 | Shin | G02B 6/0088 |
| | | | 362/632 |
| 2007/0109461 A1* | 5/2007 | Park | G02F 1/133606 |
| | | | 349/58 |
| 2007/0297195 A1* | 12/2007 | Hu | G02F 1/133606 |
| | | | 362/633 |
| 2014/0340875 A1* | 11/2014 | Hayashi | G02F 1/133308 |
| | | | 362/97.1 |
| 2016/0066449 A1* | 3/2016 | Hsiao | H05K 5/0217 |
| | | | 361/679.01 |
| 2016/0291240 A1* | 10/2016 | Sugimoto | G02B 6/005 |
| 2017/0269290 A1 | 9/2017 | Zhang | |
| 2019/0204678 A1* | 7/2019 | Hosoki | G02B 6/0056 |
| 2020/0103708 A1* | 4/2020 | Lee | G02F 1/133308 |
| 2021/0191184 A1* | 6/2021 | Zhang | G02F 1/133608 |
| 2022/0066256 A1* | 3/2022 | Baek | G02F 1/13452 |
| 2022/0128855 A1* | 4/2022 | Baek | G02F 1/133526 |
| 2023/0213802 A1* | 7/2023 | Huang | G02F 1/133314 |
| | | | 349/58 |

FOREIGN PATENT DOCUMENTS

| | | |
|---|---|---|
| TW | 201600797 A | 1/2016 |
| TW | I724785 B | 4/2021 |
| TW | 202146988 A | 12/2021 |

\* cited by examiner

DISPLAY

CROSS-REFERENCE TO RELATED APPLICATION

This non-provisional application claims priority under 35 U.S.C. § 119(a) to Patent Application No. 111126547 filed in Taiwan, R.O.C. on Jul. 14, 2022, the entire contents of which are hereby incorporated by reference.

BACKGROUND

Technical Field

The instant disclosure relates to a display, in particular, to a rotatable display.

Related Art

Recently, owing to the innovations in relevant technologies, market developments of displays become popular, and the displays are widely applied to various electronic devices. The display may be rotated and placed vertically (in a portrait orientation) or placed horizontally (in a landscape orientation) for different application scenarios. When the display is rotated from the landscape orientation to the portrait orientation, the optical film of the display is prone to hang down or to have displacements owing to insufficient limiting of the optical film. As a result, the optical quality of the display is not good. Moreover, because high-level displays specifically demand the optical brightness of the display to be uniform, how to limit the optical film of the display efficiently is an issue.

SUMMARY

In view of this, in one embodiment, a display is provided and comprises a frame body and an optical film. The frame body comprises a base, a first sidewall, a second sidewall, a third sidewall, and a fourth sidewall. The first sidewall, the second sidewall, the third sidewall, and the fourth sidewall are respectively perpendicular to the base. The first sidewall is perpendicular to the second sidewall, the second sidewall is perpendicular to the third sidewall, the third sidewall is perpendicular to the fourth sidewall, and the fourth sidewall is perpendicular to the first sidewall, so that the first sidewall, the second sidewall, the third sidewall, the fourth sidewall, and the base form an accommodating space. Each of the first sidewall and the third sidewall has a first positioning structure. Two end portions of each of the second sidewall and the fourth sidewall are bent toward the accommodating space to form a plurality of second positioning structures. The optical film is disposed in the accommodating space. The optical film comprises a main body, a plurality of first positioning pieces, and a plurality of second positioning pieces. The main body has a first side, a second side, a third side, and a fourth side sequentially connected to each other. The first positioning pieces are respectively at the first side and the third side, and each of the first positioning structures passes through a corresponding one of the first positioning pieces. The second positioning pieces are disposed at four corners of the main body, the second positioning pieces respectively extend along a direction parallel to the first side or the third side, and each of the second positioning pieces corresponds to a corresponding one of the second positioning structures.

In some embodiments, each of the first positioning pieces comprises a limiting structure, the limiting structure comprises an open end and a closed end opposite to the open end, and the open end is at an edge portion of the first side or an edge portion of the third side.

In some embodiments, a distance is between an edge portion of the closed end of each of the first positioning pieces and the corresponding one of the first positioning structures passing through the first positioning piece.

In some embodiments, each of the first positioning pieces further comprises a protrusion extending toward a direction away from the accommodating space, and for each of the first positioning pieces, the limiting structure is at the protrusion.

In some embodiments, the display further comprises two receiving portions. One of the two receiving portions is between the second sidewall and the second positioning structure which is bent toward the accommodating space and formed by the second sidewall, and the other one of the two receiving portions is between the fourth sidewall and the second positioning structure which is bent toward the accommodating space and formed by the fourth sidewall.

In some embodiments, the display further comprises a plurality of light emitting modules respectively received in the two receiving portions.

In some embodiments, each of the second positioning pieces has a first extension portion and a second extension portion. The first extension portion and the second extension portion extend along the direction parallel to the first side or the third side, and each of the second positioning structures is between the first extension portion and the second extension portion of the corresponding one of the second positioning pieces.

Based on the above, in one or some embodiments of the instant disclosure, a display is provided. In the display, the optical film can be positioned by configuring the second positioning pieces at the four corners of the optical film to abut against the second positioning structures. Therefore, when the display is rotated by 90 degrees, the optical film can be also positioned by configuring the first positioning structures at the first sidewall and the third sidewall to pass through the first positioning pieces. Therefore, according to one or some embodiments of the instant disclosure, no matter the display is rotated to be placed vertically (in the portrait orientation) or placed horizontally (in the landscape orientation), the optical film of the display can be positioned properly. Hence, the issue that the optical film of the display hangs down or to has excessive displacements owing to insufficient limiting of the optical film which causes the poor optical quality of the display can be prevented.

Moreover, in one or some embodiments of the instant disclosure, the two end portions of each of the second sidewall and the fourth sidewall of the frame body are bent toward the accommodating space to form the second positioning structures. Therefore, the second positioning structures can be formed upon the formation of the frame body for limiting and positioning the optical film. Furthermore, through the configuration of the bending directions of the first positioning structures and the second positioning structures, the first positioning structures and the second positioning structures can be formed without affecting the thickness specification of the display.

BRIEF DESCRIPTION OF THE DRAWINGS

The disclosure will become more fully understood from the detailed description given herein below for illustration only, and thus not limitative of the disclosure, wherein.

DETAILED DESCRIPTION

Figure 1:
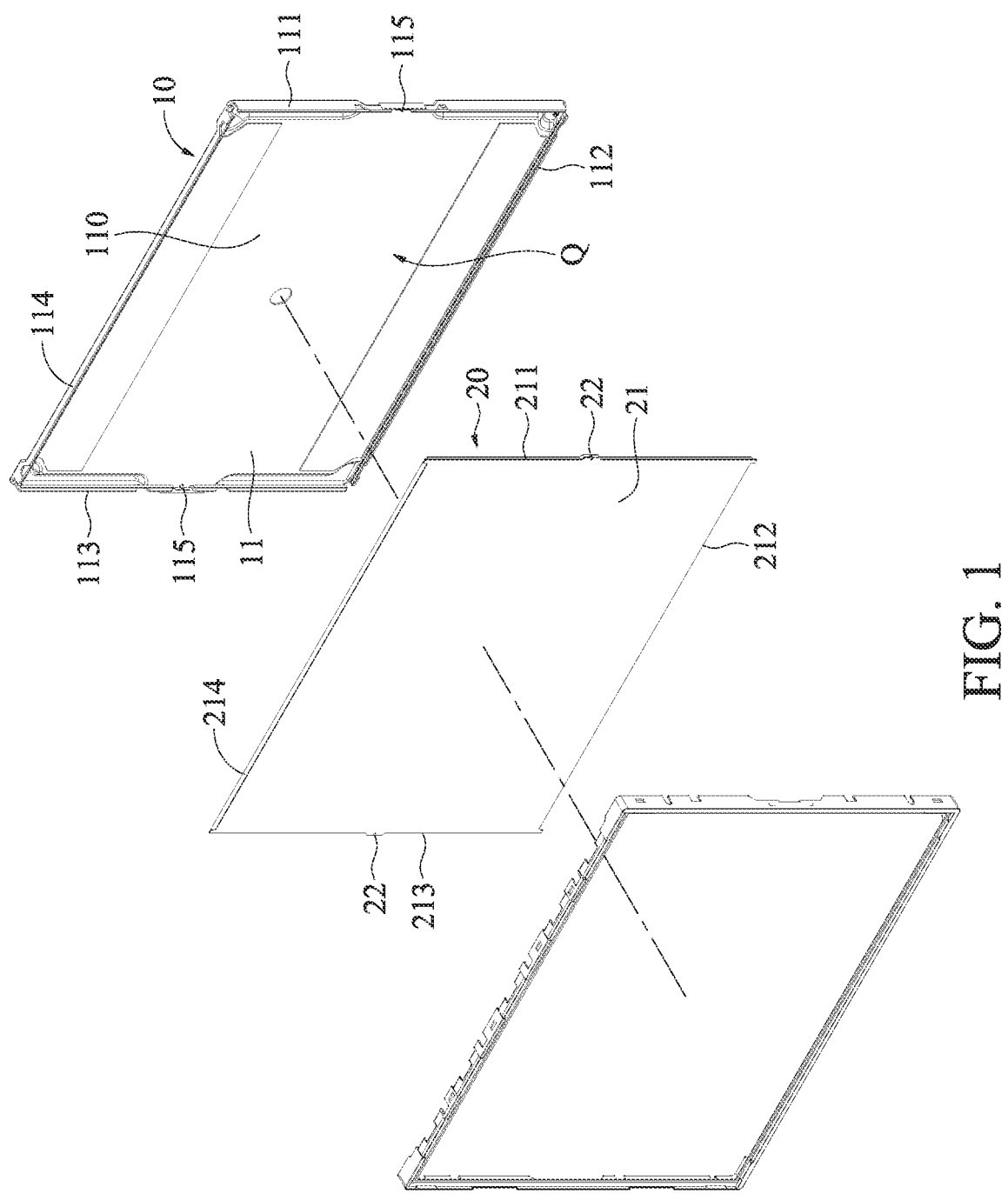
FIG. 1 illustrates an exploded view of a display according to a first embodiment of the instant disclosure.
Figure 2:
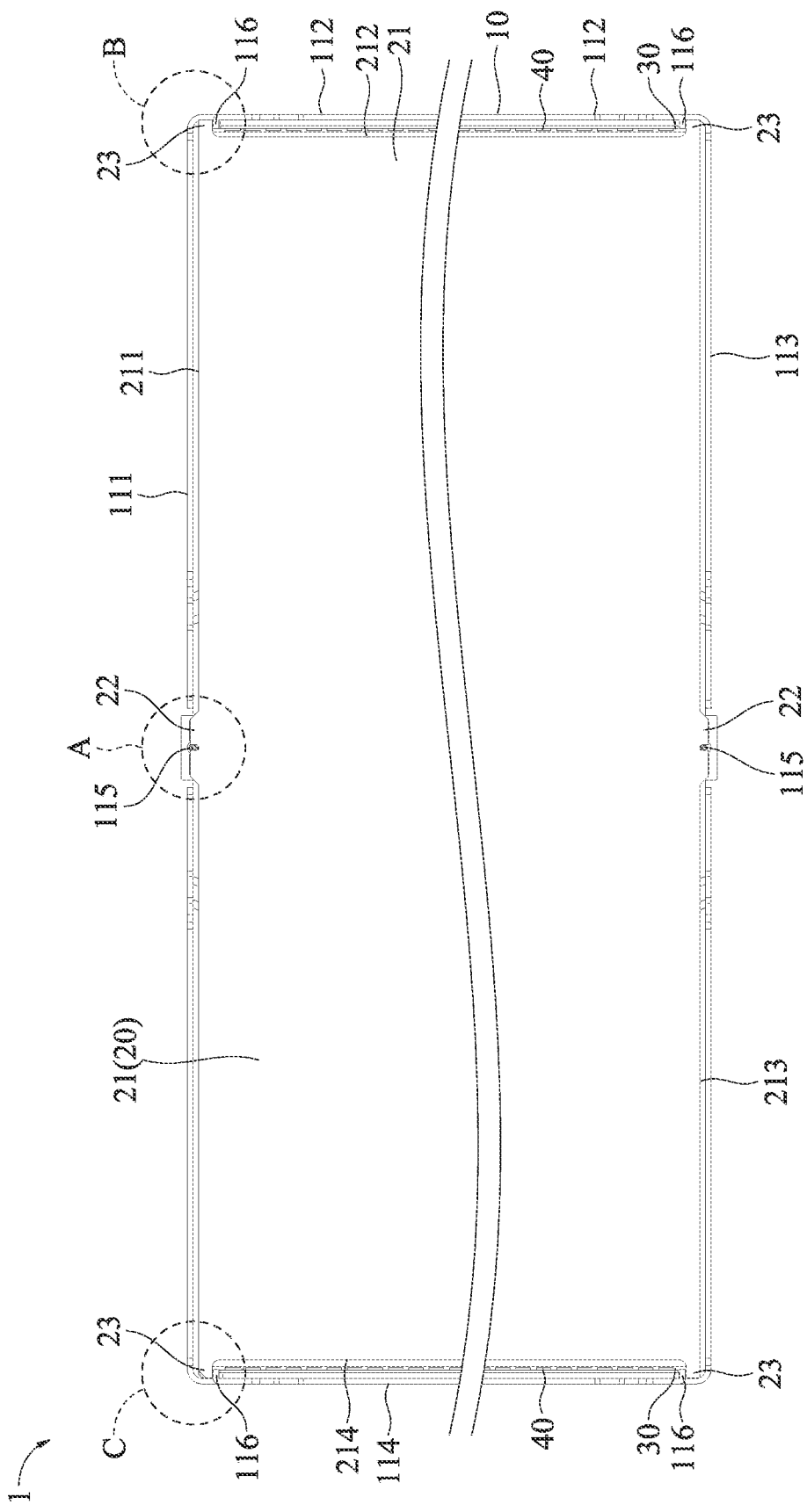
FIG. 2 illustrates a top partial view of the display according to the first embodiment of the instant disclosure.

Please refer to FIG. 1 and FIG. 2. FIG. 1 illustrates an exploded view of a display according to a first embodiment of the instant disclosure, and FIG. 2 illustrates a top partial view of the display according to the first embodiment of the instant disclosure. FIG. 2 illustrates a top view of the display after the display in FIG. 1 is rotated by 90 degrees and a middle portion of the display is omitted. In one embodiment, a display 1 is provided and comprises a frame body 10 and an optical film 20.

As shown in FIG. 1, the frame body 10 comprises a base 11, a first sidewall 111, a second sidewall 112, a third sidewall 113, and a fourth sidewall 114. In this embodiment, the first sidewall 111, the second sidewall 112, the third sidewall 113, and the fourth sidewall 114 are respectively perpendicular to the base 11. Moreover, the first sidewall 111 is perpendicular to the second sidewall 112, the second sidewall 112 is perpendicular to the third sidewall 113, the third sidewall 113 is perpendicular to the fourth sidewall 114, and the fourth sidewall 114 is perpendicular to the first sidewall 111, so that the first sidewall 111, the second sidewall 112, the third sidewall 113, the fourth sidewall 114, and the base 11 are enclosed to form an accommodating space Q. The optical film 20 can be disposed in the accommodating space Q. The optical film 20 comprises a main body 21, a plurality of first positioning pieces 22, and a plurality of second positioning pieces 23. As shown in FIG. 2, as an illustrative example, the optical film 20 comprises two first positioning pieces 22 and four second positioning pieces 23.

Figure 3:
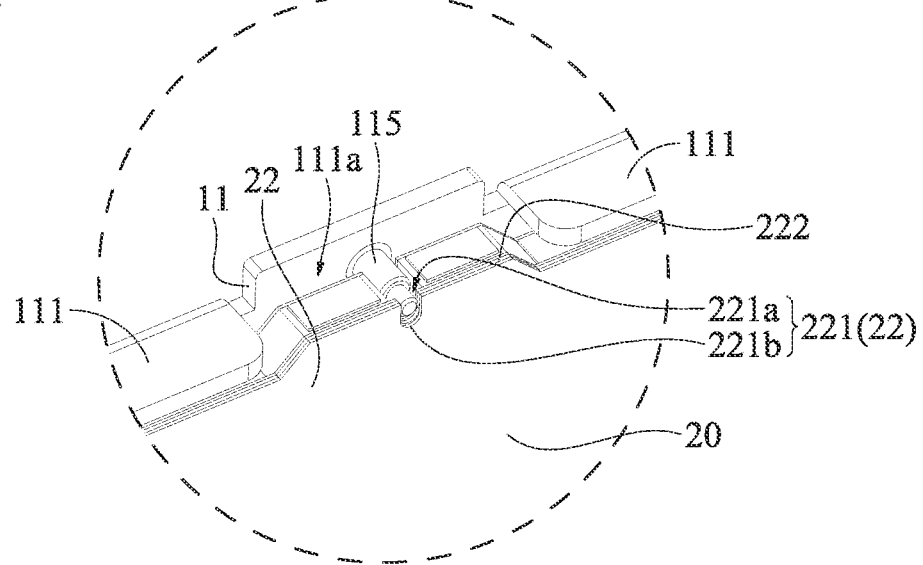
FIG. 3 illustrates an enlarged partial view of the portion A shown in FIG. 2.
Figure 4:
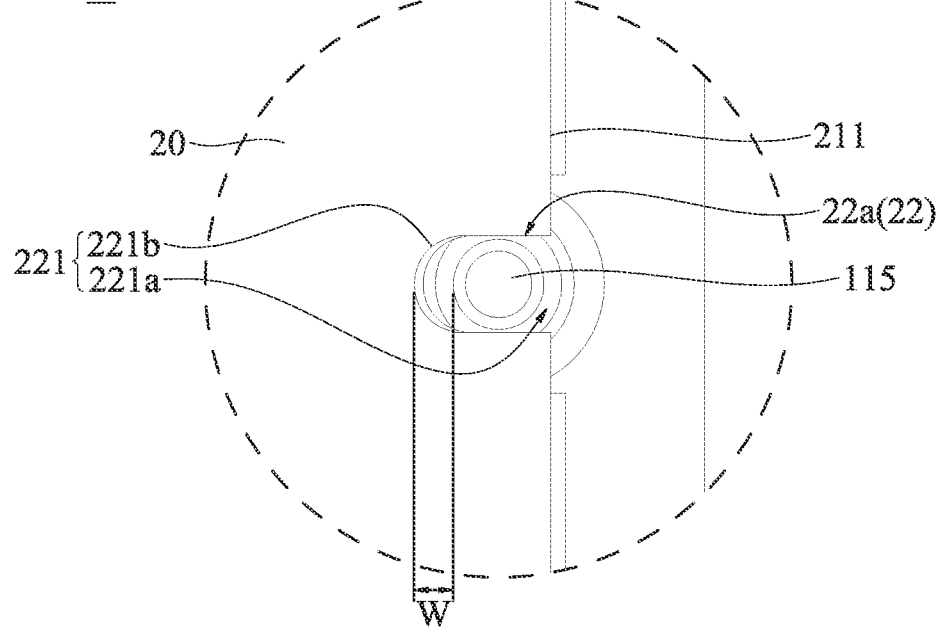
FIG. 4 illustrates an enlarged partial view of the portion A shown in FIG. 2 where the portion A is rotated by 90 degrees.

Please refer to FIG. 2 to FIG. 4. FIG. 3 illustrates an enlarged partial view of the portion A shown in FIG. 2, and FIG. 4 illustrates an enlarged partial view of the portion A shown in FIG. 2 where the portion A is rotated by 90 degrees. Each of the first sidewall 111 and the third sidewall 113 has a first positioning structure 115. In some embodiments, the first positioning structure 115 is perpendicularly arranged on the base 11, and the first positioning structure 115 is substantially of a columnar shape or a cone shape (in the case that the first positioning structure 115, the first positioning structure 115 is tapered from the upper surface of the base 11 toward a direction away from the base 11). Therefore, the first positioning structure 115 can correspondingly pass through the first positioning piece 22 of the optical film 20.

Figure 5:
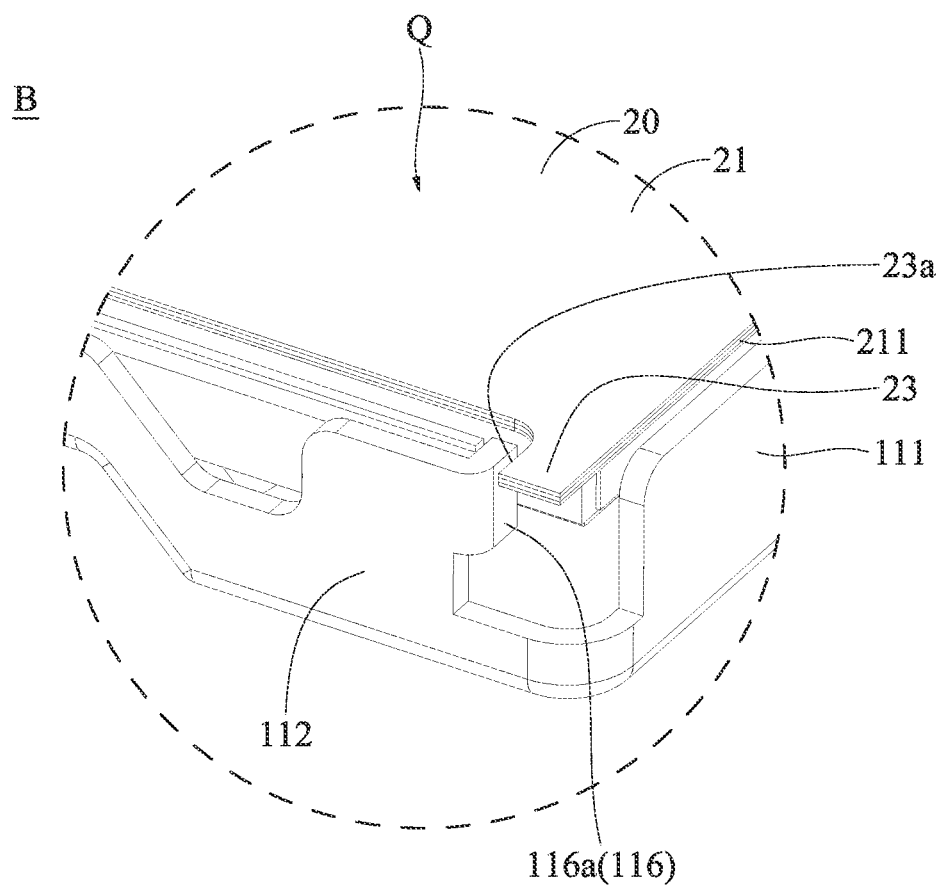
FIG. 5 illustrates an enlarged partial view of the portion B shown in FIG. 2 from another viewing angle.
Figure 6:
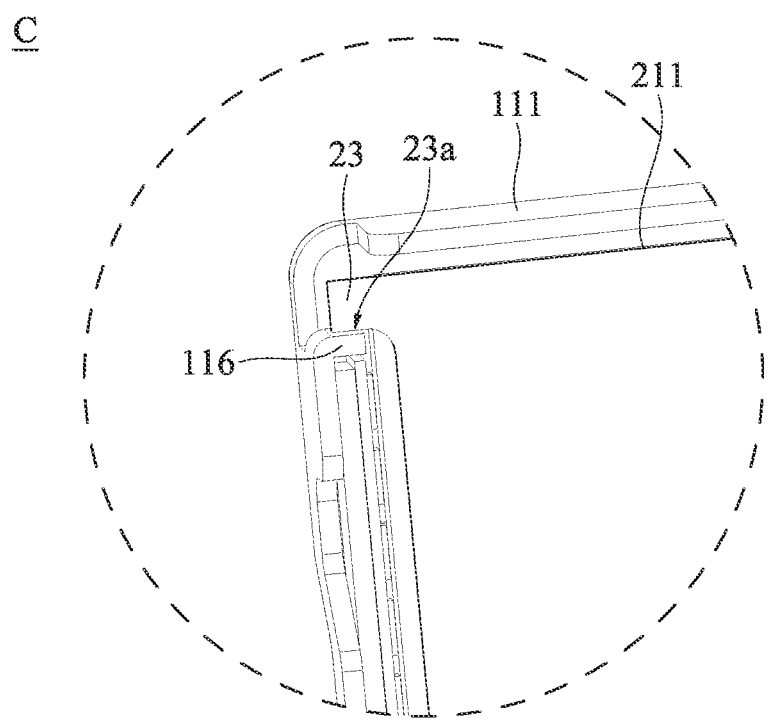
FIG. 6 illustrates an enlarged partial view of the portion C shown in FIG. 2 from another viewing angle.

Please refer to FIG. 2, FIG. 5, and FIG. 6. FIG. 5 illustrates an enlarged partial view of the portion B shown in FIG. 2 from another viewing angle. FIG. 6 illustrates an enlarged partial view of the portion C shown in FIG. 2 from another viewing angle. Two end portions of each of the second sidewall 112 and the fourth sidewall 114 are bent toward the accommodating space Q to form a plurality of second positioning structures 116. As shown in FIG. 2, for illustrative purposes, the display 1 comprises four second positioning structures 116, but the number of the second positioning structures 116 is not limited in the instant disclosure. In some embodiments, the two end portions of the second sidewall 112 and the two end portions of the fourth sidewall 114 are not connected to the first sidewall 111 and the third sidewall 113. Hence, a fixation space is between the second positioning structure 116 and the first sidewall 111 or the third sidewall 113 adjacent to the second positioning structure 116. Therefore, as shown in FIG. 6, the second positioning piece 23 of the optical film 20 can be accommodated in the fixation space, and an inner side portion 23a of each of the second positioning pieces 23 abuts against a surface 116a of a corresponding one of the second positioning structures 116 (as shown in FIG. 5).

Please refer to FIG. 1 and FIG. 2. The optical film 20 comprises a main body 21, a plurality of first positioning pieces 22, and a plurality of second positioning pieces 23. The main body 21 of the optical film 20 has a first side 211, a second side 212, a third side 213, and a fourth side 214 sequentially connected to each other. As shown in FIG. 2, as an illustrative example, the optical film 20 comprises two first positioning pieces 22, but the number of the first positioning pieces 22 is not limited in the instant disclosure. The two first positioning pieces 22 are respectively at the first side 211 and the fourth side 213, as shown in FIG. 3 and FIG. 4, and each of the first positioning structures 115 passes through a corresponding one of the first positioning pieces 22. Therefore, as shown in FIG. 4, when the display 1 is placed horizontally (the landscape orientation shown in FIG. 1), the inner side portion 22a of each of the first positioning pieces 22 abuts against the corresponding one of the first positioning structures 115. Hence, the optical film 20 is provided with supporting forces symmetrically. Consequently, the issue that the optical film 20 of the display 1 hangs down or to has displacements owing to insufficient supporting forces or improper supporting manners of the optical film 20 which thus affects the optical quality of the display 1 can be prevented.

Please refer to FIG. 2, FIG. 5, and FIG. 6. The second positioning pieces 23 of the optical film 20 are disposed at four corners of the main body 21. In this embodiment, as an illustrative example, the optical film 20 comprises four second positioning pieces 23, but the number of the second positioning pieces 23 is not limited in the instant disclosure. Each of the second positioning pieces 23 extend along a direction parallel to the first side 211 or the third side 213, and each of the four second positioning pieces 23 corresponds to the corresponding one of the four second positioning structures 116. As shown in FIG. 5 and FIG. 6, the second positioning piece 23 is accommodated in the fixation space between the second positioning structure 116 and the first sidewall 111 or the third sidewall 113 adjacent to the second positioning structure 116, and the second positioning piece 23 has an inner side portion 23a parallel to the first side 211 or the third side 213. When the display 1 is rotated to be placed vertically (for example, from the landscape orientation shown in FIG. 1 to the portrait orientation shown in FIG. 2), the inner side portion 23a of each of the second positioning pieces 23 abuts against the corresponding one of the second positioning structures 116. Consequently, when the display 1 is placed vertically, the second positioning pieces 23 are respectively positioned by the second positioning structures 116. Therefore, the issue that the optical film 20 of the display 1 hangs down or to has excessive displacements owing to insufficient supporting forces or improper supporting manners of the optical film 20 which thus affects the optical quality of the display 1 can be prevented.

Therefore, when the display 1 is placed vertically (as the orientation shown in FIG. 2), the second positioning pieces 23 at the four corners of the optical film 20 abut against the second positioning structures 116, so that the optical film 20 can be supported and positioned by the second positioning structures 116. On the other hand, when the display 1 is rotated by 90 degrees and placed horizontally (as the orientation shown in FIG. 1), the two first positioning structures 115 at the first sidewall 111 and the third sidewall 113 respectively pass through the first positioning pieces 22, so that the optical film 20 can be supported and positioned by the first positioning structures 22 (as shown in FIG. 4). Therefore, according to one or some embodiments of the instant disclosure, no matter the display 1 is rotated to be placed vertically (in the portrait orientation) or placed horizontally (in the landscape orientation), the optical film 20 of the display 1 can be positioned properly. Hence, the issue that the optical film 20 of the display 1 hangs down or has excessive displacements owing to insufficient limiting of the optical film 20 which causes the poor optical quality of the display 1 can be prevented. Moreover, in one or some embodiments of the instant disclosure, the two end portions of each of the second sidewall 112 and the fourth sidewall 114 of the frame body 10 are bent toward the accommodating space Q to form the second positioning structures 116. Therefore, the second positioning structures 116 can be formed upon the formation of the frame body 10 for limiting and positioning the optical film 20. Furthermore, through the configuration of the bending directions of the first positioning structures 115 and the second positioning structures 116, the first positioning structures 115 and the second positioning structures 116 can be formed without affecting the thickness specification of the display 1.

Please refer to FIG. 2, FIG. 3, and FIG. 4. In this embodiment, each of the first positioning pieces 22 may comprise a limiting structure 221. The limiting structure 221 comprises an open end 221a and a closed end 221b opposite to the open end 221a, and the open end 221a is at an edge portion of the first side 211 or an edge portion of the third side 213. In other words, in this embodiment, if the first positioning structure 22 is at the first side 211, the open end 221a is at the edge portion of the first side 211, so that the limiting structure 221 is formed as an opening facing the first side 211; on the other hand, if the first positioning structure 22 is at the third side 213, the open end 221a is at the edge portion of the third side 213, so that the limiting structure 221 is formed at an opening facing the third side 213. In this embodiment, the limiting structure 221 may be a U-shaped structure (as shown in FIG. 3 and FIG. 4), a V-shaped structure, or the like and has the open end 221a and the closed end 221b opposite to each other.

Therefore, when the frame body 10 or the optical film 20 is heated and expanded, the open end 221a of the limiting structure 221 provides a clearance for thermal expansion and contraction of the components of the display 1 to prevent the first positioning structure 115 from squeezing the first positioning piece 22. Hence, the distortion or deformation of the optical film 20 caused by applying a force on the optical film 20 can be prevented.

Moreover, in one or some embodiments of the instant disclosure, during the rotation of the display 1 (for example, during the display 1 is rotated from the landscape orientation shown in FIG. 1 to the portrait orientation shown in FIG. 2), because of the arced structure of the closed end 221b, the closed end 221b of the limiting structure 221 can abut against the first positioning structure 115 no matter what the rotation angle of the display 1 is. Also, the issue that the optical film 20 has excessive displacements which causes the poor optical quality of the display 1 can be prevented.

Please refer to FIG. 4. For each of the first positioning pieces 22, a distance W is between an edge portion of the closed end 221b of each of the first positioning pieces 22 and the corresponding one of the first positioning structures 115 passing through the first positioning piece 22. The distance W is provided as a clearance for thermal expansion and contraction to prevent the first positioning structure 115 from squeezing the first positioning piece 22. Hence, the distortion or deformation of the optical film 20 caused by applying a force on the optical film 20 can be prevented. Moreover, during the rotation of the display 1, the distance W also provides a space for the displacement of the components of the display 1.

Please refer to FIG. 3. Each of the first positioning pieces 22 may further comprise a protrusion 222 extending toward a direction away from the accommodating space Q, and for each of the first positioning pieces 22, the limiting structure 221 is at the protrusion 222. As shown in FIG. 3, the first sidewall 111 is not arranged on the side of the base 11 continuously, a discontinuous portion of the first sidewall 111 is formed as an accommodating opening 111a, and the first positioning structure 115 and the first positioning piece 22 are at the accommodating opening 111a. In other words, in this embodiment, the first sidewall 111 is at the two ends of the assembly of the first positioning structure 115 and the first positioning piece 22. In this embodiment, the structure of the third sidewall 113 is the same as the structure of the first sidewall 111 and thus is not iterated. Therefore, because the first positioning structure 115 and the first positioning piece 22 are at the accommodating opening 111a, the widths of the frame body 10 of the display 1 corresponding to the first side 211 and the third side 213 can be reduced, thereby increasing the area of the display region of the display 1.

Moreover, when the frame body 10 or the optical film 20 is heated and expanded, according to one or some embodiments, the second positioning structure 116 is merely abutted against by the inner side portion 23a of the second positioning piece 23 (only one of the inner side portions 23a of the second positioning piece 23 abuts against the second positioning structure 116). Therefore, the issue that the distortion or deformation at corners of the optical film 20 due to using the positioning posts to pass through the four corners of the optical film 20 which is known to the inventor can be prevented.

Figure 7:
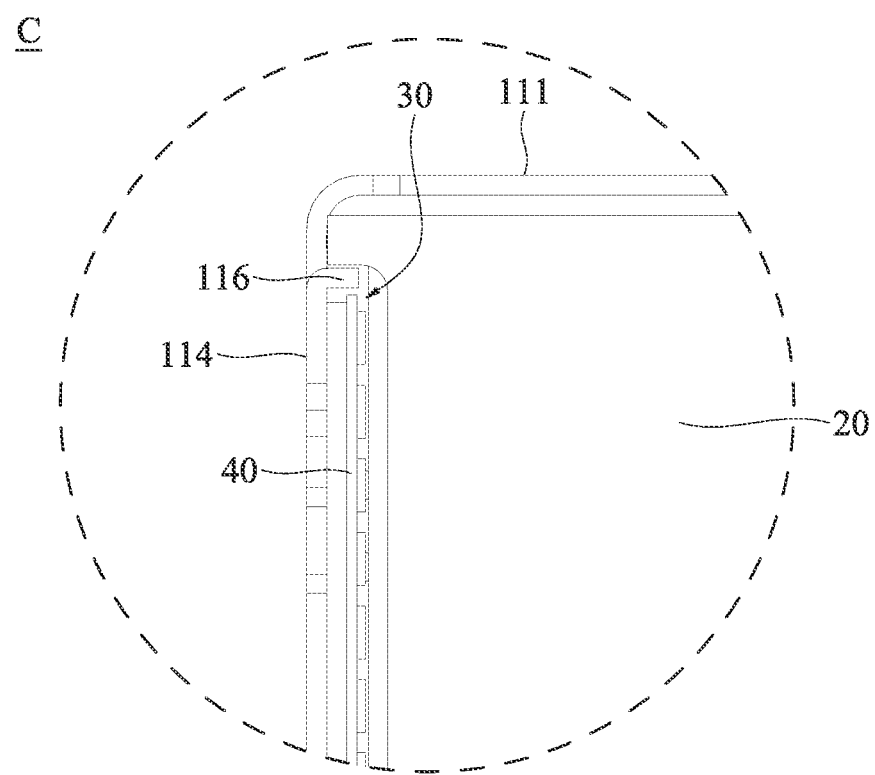
FIG. 7 illustrates an enlarged partial view of the portion C shown in FIG. 2.
Figure 8:
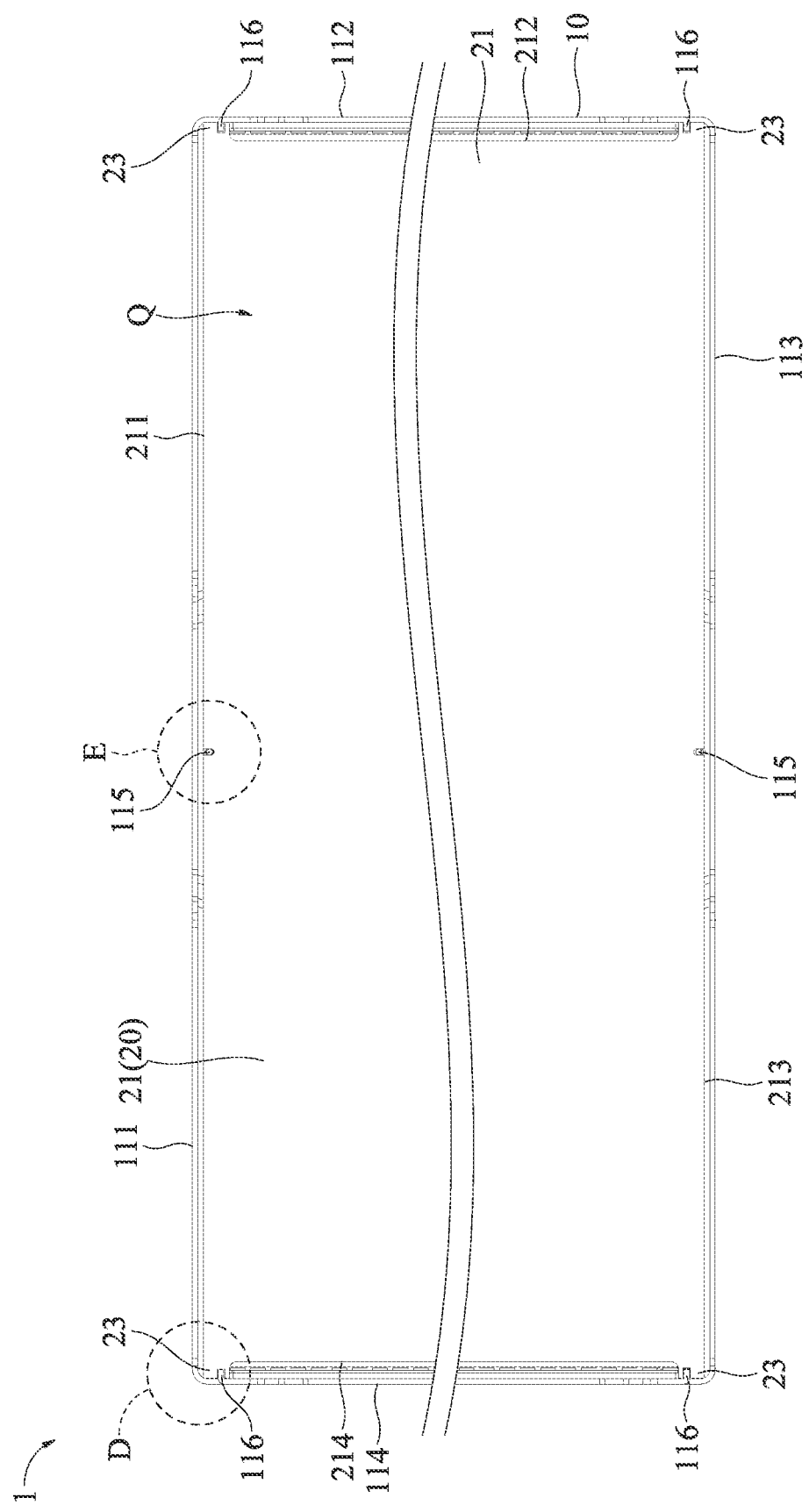
FIG. 8 illustrates a top partial view of a display according to a second embodiment of the instant disclosure.

Please refer to FIG. 2 and FIG. 7. FIG. 7 illustrates an enlarged partial view of the portion C shown in FIG. 2. In some embodiments, the display 1 further comprises a plurality of receiving portions 30. As shown in FIG. 7, for illustrative purposes, the display 1 comprises two receiving portions 30. One of the two receiving portions 30 is between the fourth sidewall 114 and the second positioning structure 116 which is bent toward the accommodating space Q and formed by the fourth sidewall 116, and the other one of the two receiving portions 30 is between the second sidewall 112 and the second positioning structure 116 which is bent toward the accommodating space Q and formed by the second sidewall 112. As shown in FIG. 8, the two receiving portions 30 are symmetrically arranged. Therefore, the second positioning structure 116 not only can position the optical film 20 and the frame body 10 but also can form the receiving portion 30 together with the second sidewall 112 or the fourth sidewall 114, thus facilitating the slim configuration of the display 1.

Please refer to FIG. 2 and FIG. 7. In some embodiments, the display 1 further comprises a plurality of light emitting modules 40 received in the receiving portions 30. Therefore, in this embodiment, the display 1 is not required to configure the structure for receiving the light emitting modules 40 additionally, thus facilitating the lightweight and slim configuration of the display 1.

Figure 9:
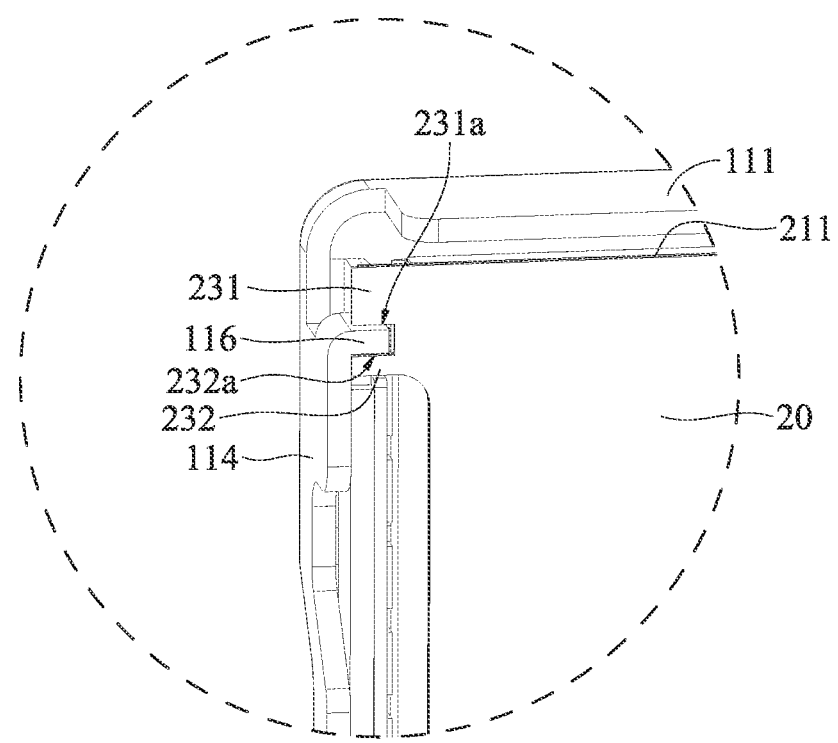
FIG. 9 illustrates an enlarged partial view of the portion D shown in FIG. 8 from another viewing angle.

Please refer to FIG. 8 and FIG. 9. FIG. 8 illustrates a top partial view of a display according to a second embodiment of the instant disclosure, and FIG. 9 illustrates an enlarged partial view of the portion D shown in FIG. 8 from another viewing angle. It is noted that, the components in this embodiment same as the components in the first embodiment are given with the same reference numerals, and the description for the components are not iterated again.

In this embodiment, each of the second positioning pieces 23 has a first extension portion 231 and a second extension portion 232. The first extension portion 231 and the second extension portion 232 extend along the direction parallel to the first side 211 or the third side 213. Each of the second positioning structures 116 is between the first extension portion 231 and the second extension portion 232 of the corresponding one of the second positioning pieces 23.

In the first embodiment where the display 1 is rotated to be placed vertically (the display 1 is rotated from the landscape orientation shown in FIG. 1 to the portrait orientation shown in FIG. 2), only the inner side portions 23a of the second positioning pieces 23 at the top of the optical film 20 abut against the second positioning structures 116 to provide the supporting force for the optical film 20. On the other hand, in this embodiment, when the display 1 is placed vertically (as shown in FIG. 8), the inner side portions 231a of the first extension portions 231 at the upper right and left corners of the optical film 20 abut against the second positioning structures 116, and the inner side portions 232a of the second extension portions 232 at the lower right and left corners of the optical film 20 also abut against the second positioning structure 116. Therefore, the optical film 20 can be supported through the first extension portions 231 at the upper portion of the optical film 20 and the second extension portions 232 at the lower portion of the optical film 20. Hence, the supporting force is not focused on the two first extension portions 231 to prevent the second positioning pieces 23 at the upper portion of the optical film 20 from being deformed or broken after a long-term use of the display 1. Similarly, after the display 1 is rotated by 180 degrees, the same effect can be achieved; that is, in this embodiment, the inner side portions 231a of the first extension portions 231 at the upper right and left corners of the optical film 20 abut against the second positioning structures 116, and the inner side portions 232a of the second extension portions 232 at the lower right and left corners of the optical film 20 also abut against the second positioning structure 116. In other words, in this embodiment, when the display 1 is placed vertically, the optical film 20 is supported by the first extension portions 231 and the second extension portions 232 at the same time. Therefore, the second positioning pieces 23 at the upper portion of the optical film 20 can be prevented from being deformed or broken easily, thus prolonging the service life of the display 1.

Figure 10:
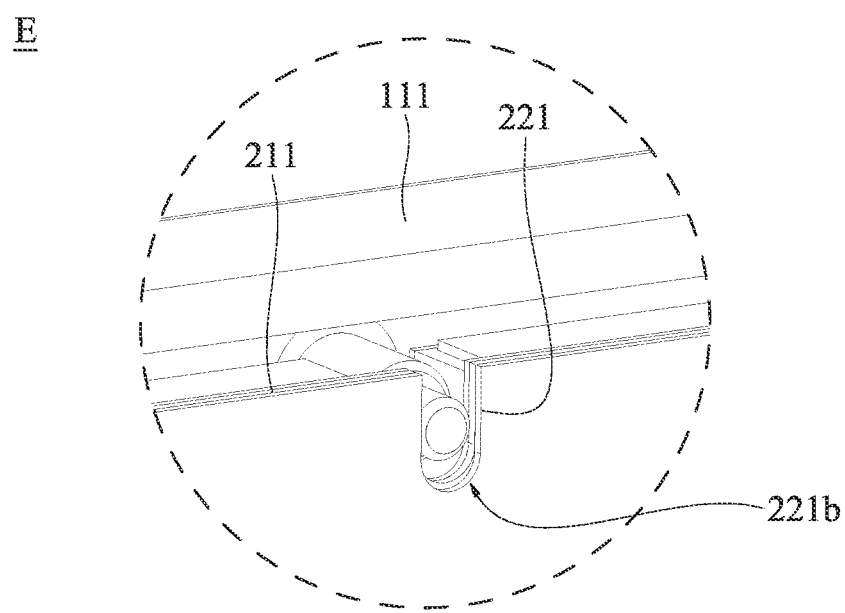
FIG. 10 illustrates an enlarged partial view of the portion E shown in FIG. 8 from another viewing angle.

Please refer to FIG. 8 and FIG. 10. FIG. 10 illustrates an enlarged partial view of the portion E shown in FIG. 8 from another viewing angle. In this embodiment, the first positioning piece 22 does not have the protrusion 222 (for example, the protrusion 222 shown in FIG. 3), so that the closed end 221b of the limiting structure 221 is at an inner side of the first side 211. In other words, in this embodiment, the closed end 221b of the limiting structure 221 is in the accommodating space Q.

It is noted that, the embodiment that the first positioning piece 22 does not have the protrusion 222 is as an illustrative example, but embodiments are not limited thereto; in this embodiment, the first positioning piece 22 may have the protrusion 222. Moreover, in the first embodiment, the first positioning piece 22 may not have the protrusion 222.

As above, according to one or some embodiments of the instant disclosure, when the display 1 is placed vertically (as the orientation shown in FIG. 2 and FIG. 8), the optical film 20 can be positioned by configuring the second positioning pieces 23 at the four corners of the optical film 20 to abut against the second positioning structures 116. When the display 1 is rotated by 90 degrees (as the orientation shown in FIG. 1), the optical film 20 can be also positioned by configuring the first positioning structures 115 at the first sidewall 111 and the third sidewall 113 to pass through the first positioning pieces 22 (as shown in FIG. 4). Therefore, according to one or some embodiments of the instant disclosure, no matter the display 1 is rotated to be placed vertically (in the portrait orientation) or placed horizontally (in the landscape orientation), the optical film 20 of the display 1 can be positioned properly. Hence, the issue that the optical film 20 of the display 1 hangs down or to has excessive displacements owing to insufficient limiting of the optical film 20 which causes the poor optical quality of the display 1 can be prevented. Moreover, in one or some embodiments of the instant disclosure, the two end portions of each of the second sidewall 112 and the fourth sidewall 114 of the frame body 10 are bent toward the accommodating space Q to form the second positioning structures 116. Therefore, the second positioning structures 116 can be formed upon the formation of the frame body 10 for limiting and positioning the optical film 20. Furthermore, through the configuration of the bending directions of the first positioning structures 115 and the second positioning structures 116, the first positioning structures 115 and the second positioning structures 116 can be formed without affecting the thickness specification of the display 1.

What is claimed is:

1. A display comprising:
a frame body comprising a base, a first sidewall, a second sidewall, a third sidewall, and a fourth sidewall, wherein the first sidewall, the second sidewall, the third sidewall, and the fourth sidewall are respectively perpendicular to the base; the first sidewall is perpendicular to the second sidewall, the second sidewall is perpendicular to the third sidewall, the third sidewall is perpendicular to the fourth sidewall, and the fourth sidewall is perpendicular to the first sidewall, so that the first sidewall, the second sidewall, the third sidewall, the fourth sidewall, and the base are enclosed to form an accommodating space; each of the first sidewall and the third sidewall has a first positioning structure; two end portions of each of the second sidewall and the fourth sidewall are bent toward the accommodating space to form a plurality of second positioning structures; and an optical film disposed in the accommodating space, wherein the optical film comprises a main body, a plurality of first positioning pieces, and a plurality of second positioning pieces; the main body has a first side, a second side, a third side, and a fourth side sequentially connected to each other; the first positioning pieces are respectively at the first side and the third side, and each of the first positioning structures passes through a corresponding one of the first positioning pieces; the second positioning pieces are disposed at four corners of the main body, the second positioning pieces respectively extend along a direction parallel to the first side or the third side, and each of the second positioning pieces corresponds to a corresponding one of the second positioning structures;

wherein each of the first positioning pieces comprises a limiting structure, the limiting structure comprises an open end and a closed end opposite to the open end, and the open end is at an edge portion of the first side or an edge portion of the third side.

2. The display according to claim 1, wherein a gap is formed between an edge portion of the closed end of each of the first positioning pieces and the corresponding one of the first positioning structures passing through the first positioning piece.

3. The display according to claim 1, wherein each of the first positioning pieces further comprises a protrusion extending toward a direction away from the accommodating space, and for each of the first positioning pieces, the limiting structure is at the protrusion.

4. The display according to claim 1, further comprising two receiving portions, wherein one of the two receiving portions is between the second sidewall and the second positioning structure which is bent toward the accommodating space and formed by the second sidewall, and the other one of the two receiving portions is between the fourth sidewall and the second positioning structure which is bent toward the accommodating space and formed by the fourth sidewall.

5. The display according to claim 4, further comprising a plurality of light emitting modules respectively received in the two receiving portions.

6. The display according to claim 1, wherein each of the second positioning pieces has a first extension portion and a second extension portion; the first extension portion and the second extension portion extend along the direction parallel to the first side or the third side, and each of the second positioning structures is between the first extension portion and the second extension portion of the corresponding one of the second positioning pieces.

* * * * *